United States Patent
Brankovic et al.

(10) Patent No.: US 6,600,913 B1
(45) Date of Patent: Jul. 29, 2003

(54) TWO-PORT DEMODULATION DEVICE

(75) Inventors: Veselin Brankovic, Esslingen (DE); Kenichi Kawasaki, San Diego, CA (US); Dragan Krupezevic, Stuttgart (DE); Mohamed Ratni, Esslingen (DE)

(73) Assignees: Sony International (Europe) GmbH, Berlin (DE); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/698,574

(22) Filed: Oct. 27, 2000

(51) Int. Cl.[7] ................................. H04B 1/26
(52) U.S. Cl. ................ 455/324; 455/323; 455/313; 455/314; 455/225
(58) Field of Search .................. 455/324, 313, 455/314, 323, 225

(56) References Cited

U.S. PATENT DOCUMENTS

| | | | | |
|---|---|---|---|---|
| 5,212,827 A | * | 5/1993 | Meszko et al. ............. 455/219 |
| 5,230,011 A | * | 7/1993 | Gielis et al. ................... 379/97 |
| 5,579,347 A | * | 11/1996 | Lindquist et al. ........... 375/346 |
| 5,640,698 A | * | 6/1997 | Shen et al. ................. 455/323 |
| 5,937,341 A | * | 8/1999 | Suominen ................... 455/324 |
| 6,009,317 A | * | 12/1999 | Wynn .......................... 455/296 |
| 6,111,475 A | * | 8/2000 | Giugni ........................ 333/103 |
| 6,243,177 B1 | * | 6/2001 | Duerksen ................... 359/127 |

* cited by examiner

Primary Examiner—Edward F. Urban
Assistant Examiner—Marceau Milord
(74) Attorney, Agent, or Firm—Frommer Lawrence & Haug LLP; William S. Frommer; Bruno Polito

(57) ABSTRACT

A two-port millimeter-wave demodulation device is particularly adapted for wireless 60 GHz transmission systems.

The device for the downconversion and demodulation of a modulated RF signal does not comprise a mixing stage. The RF signal to be downconverted is supplied to a linear two-port device having a single power sensor connected to the output of the two-port device. The two-port device comprises a three-port junction having two inputs and one output connected to the power sensor. One input of the three-port junction is supplied to the RF signal and the other input of the three-port junction is supplied (without switching) with a further RF signal originating either from a local oscillator or with a signal derived from the RF signal to be downconverted.

FIG. 2

25 Claims, 19 Drawing Sheets

Possible System Application Scenario

TWO-PORT DEMODULATION DEVICE

The six-port technology which up to recent years has been used for complex measurements of RF signals can also be used for receiving modulated or RF signals. Receivers built on the basis of the six-port technology act in the direct conversion manner allowing conversion from millimeter wave range in microwave range directly to the base band without any mixing to intermediate frequencies.

Technical details of six-port receiver and/or direct port receiver in general can be found, for example, in WO 099/33166. As the present invention is a further development of the N-port receiver technology, regarding the implementation of the elements building up the N-port receiver reference is explicitly made to said WO 099/33166 which is herewith incorporated by reference.

From EP 1011204 A1 a three-port junction receiver is known. This document proposes a direct receiver technique based on one power measurement and time multiplexing of input signals. This known technique bases on the passive linear three-port high frequency circuitry having two RF signal inputs and one output port attached to a power sensor. The signal output from the power sensor is low-pass filtered and then supplied to a DC-interface. This known technology, however, has the drawback that a RF-switch and at least one passive circuit having at least one passive shifter functionality must be provided.

Generally, millimeter-wave communication systems may play an important role in the future. The 60 GHz range is worldwide open for high data-rate short-range communication, where an operation bandwidth of approximately 4 GHz is allocated. When specifying an air-interface for said frequency range, the following constraints have to be coped with:

very high data rates (channel bandwidth up to 2 GHz), simple RF direct down conversion also in a very high frequency rang, for example 60 GHz, simple baseband processing (A/D converter with a low number of bits), no complex signal processing and therefore small power consumption, and minimum output back-of of the transmitter-power amplifier.

In consideration of these constraints, the modulation scheme has to be very simple which is compatible to the fact that usually the channel conditions are good. Depending on the application scenario, it is assumed that the channel conditions will be close to a Gaussian channel. This can result in a complete suppression of the need for equalization techniques in case a single-carrier approach is used.

In view of the above-captioned priorities is the object of the present invention to provide for a simplified down-conversion and demodulation technology for RF signals.

This object is achieved by means of the features of the independent claims. The dependent claims develop further the central idea of the present invention.

According to a first aspect of the present invention, a device for the down-conversion of a modulated RF signal without mixing stage is provided. The device comprises a linear two-port device having an input port for the RF signal to be down-converted as well as one output port. A single-power sensor is connected to the output port of the two-port device. The linear two-port device comprises a three-port junction having two inputs and one output connected to the power sensor. One input of the three-port junction is supplied with the RF signal. The other input of the three-port junction is supplied (without switching) with a further RF signal originating from a local oscillator. Alternatively, the other input of the three-port junction is supplied with a further RF signal being derived (branched-off) from the RF signal to be down-converted.

The linear two-port can comprise a three-port junction with one output to the power sensor, a first input for the RF signal to be downconverted and a second input for a RF signal branched off the RF signal to be downconverted, wherein the branching-off is effected by means of a power splitter.

A switch can be provided to selectively interrupt the branched-off RF signal.

A calculation unit can be provided for calculating the power of the RF signal to be downconverted during a time period in which the switch is in an interrupt state and therefore no branched-off RF signal is supplied to the second input of the three-port junction.

The RF signal branched off the RF signal to be downconverted can be passed through a processing unit such as a delay unit before being supplied to the second input of the three-port junction.

The delay unit can provide for a delay corresponding to the equivalent of an integer multiple of half the wave length of the carrier frequency of the RF signal to be downconverted.

The delay unit can provide for a delay corresponding to an integer multiple of a modulation state time duration of the RF signal to be downconverted.

The processing unit can comprise frequency dividing and frequency multiplying means. The division three-multiplication factor of the frequency dividing in frequency multiplying means can thereby be equal.

An automatic gate control unit for the RF signal to be downconverted can be connected to the input of the linear two-port device.

According to a further aspect of the present invention, a demodulator comprising such a device for the downconversion of a modulated RF signal without mixing stage is proposed. The demodulator comprises an analogue processing device connected to the output of the power sensor to detect the modulation states of the RF signal based on the output signal of the power sensor.

The analogue processing device can comprise an averaging as well as a hard decision unit. The hard decision unit outputs the detected modulation states of the downconverted modulated RF signal.

The demodulator can be particularly designed for demodulation of a BPSK modulated RF signal.

According to a still further aspect of the present invention, a method for the downconversion of a RF signal without mixing stage is proposed. Thereby the RF signal to be downconverted is supplied to a first input of a three-port junction. A further signal is supplied to the other input of the three-port junction. Thereby the further RF signal can originate either from a local oscillator and is supplied without switching to the other input of the three-port junction or the further RF signal is derived from the RF signal to be downconverted. Finally, the power of the output signal supplied at the output port of the three-port junction is sensed.

The further RF signal can be branched off the RF signal to be downconverted, processed and then supplied to the three-port device combining it with the RF signal to be downconverted.

The branched-off RF signal can be selectively interrupted.

The power of the RF signal to be downconverted can be calculated during a time period in which the branched-off RF signal is interrupted and therefore not supplied to the three-port junction.

The step of processing can comprise the step of delaying the branched-off RF signal before supplying it to the three-port junction.

The delay of the delay-step can correspond to the equivalent of an integer multiple of half wave lengths of the carrier frequency of the RF signal to be downconverted.

The delay can correspond to an integer multiple of a modulation state time duration of the RF signal to be downconverted.

The step of processing can comprise the steps of frequency dividing and frequency multiplying the branched-off signal.

The division/multiplication factor of the frequency-dividing and frequency-multiplying step can be equal.

The sensed power of the output of the three-port junction can be processed in an analogue manner to detect the modulation states of the RF signal.

The analogue processing steps thereby can comprise an averaging step as well as a hard- decision step.

The RF signal can be a BPSK modulated RF signal.

Further features, advantages of and objects of the present invention will become evident for the man skilled in the art when reading the following detailed description of embodiments of the present invention, taken in connection with the figures of the enclosed drawings.

Figure 3A:
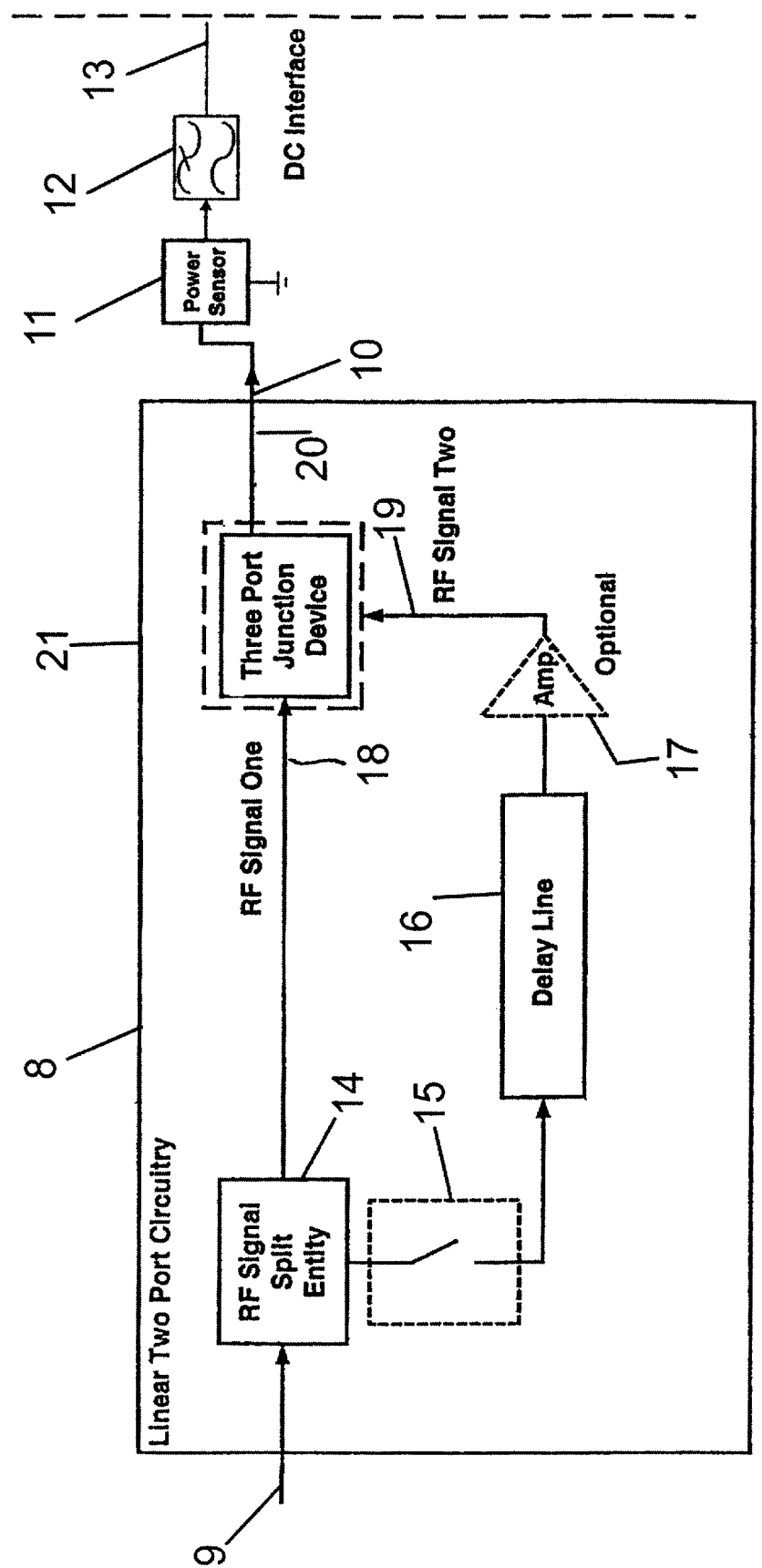
FIG. 3a shows a first option for a linear two-port circuitry.
Figure 5:
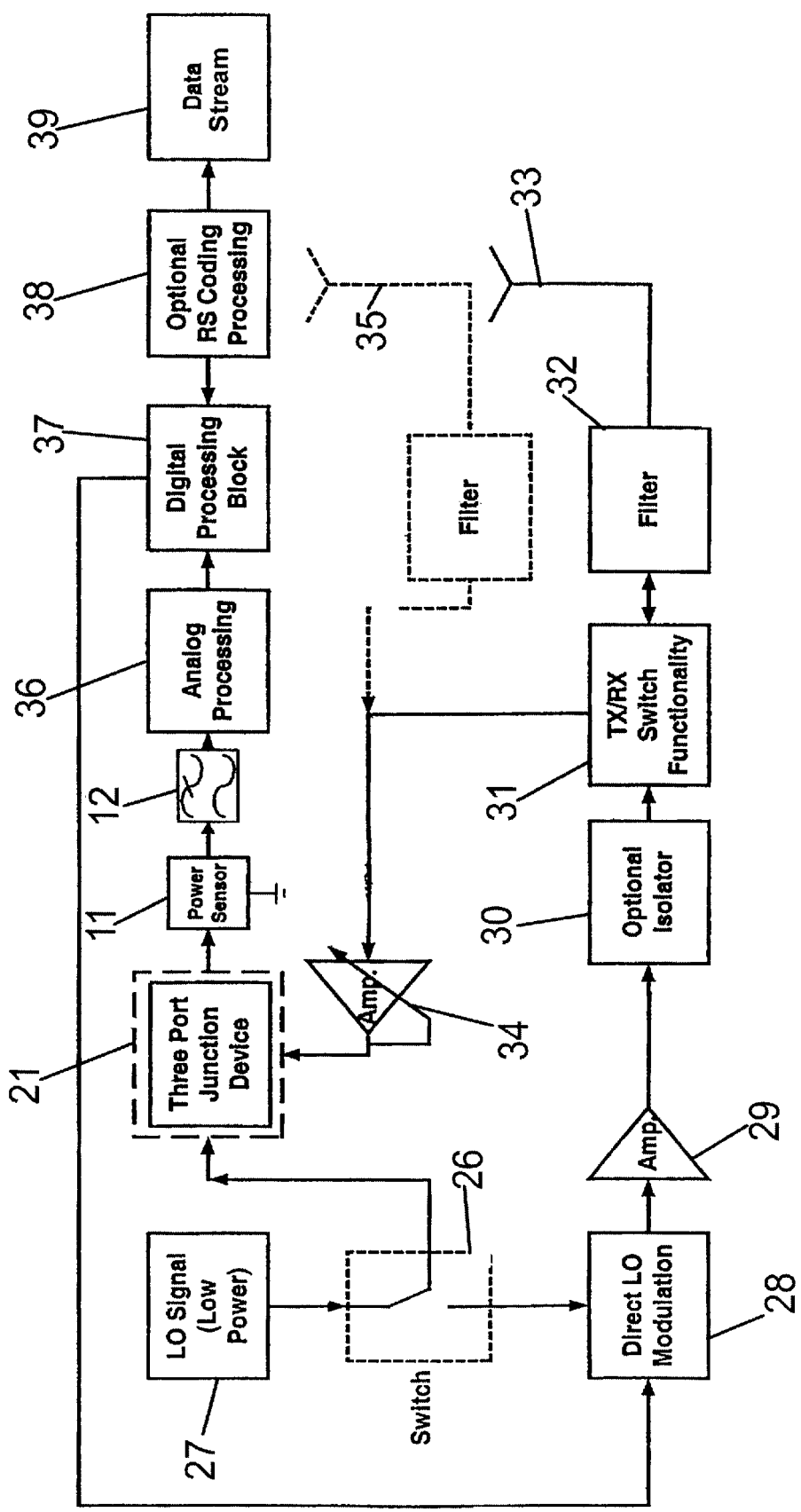
Figure 6:
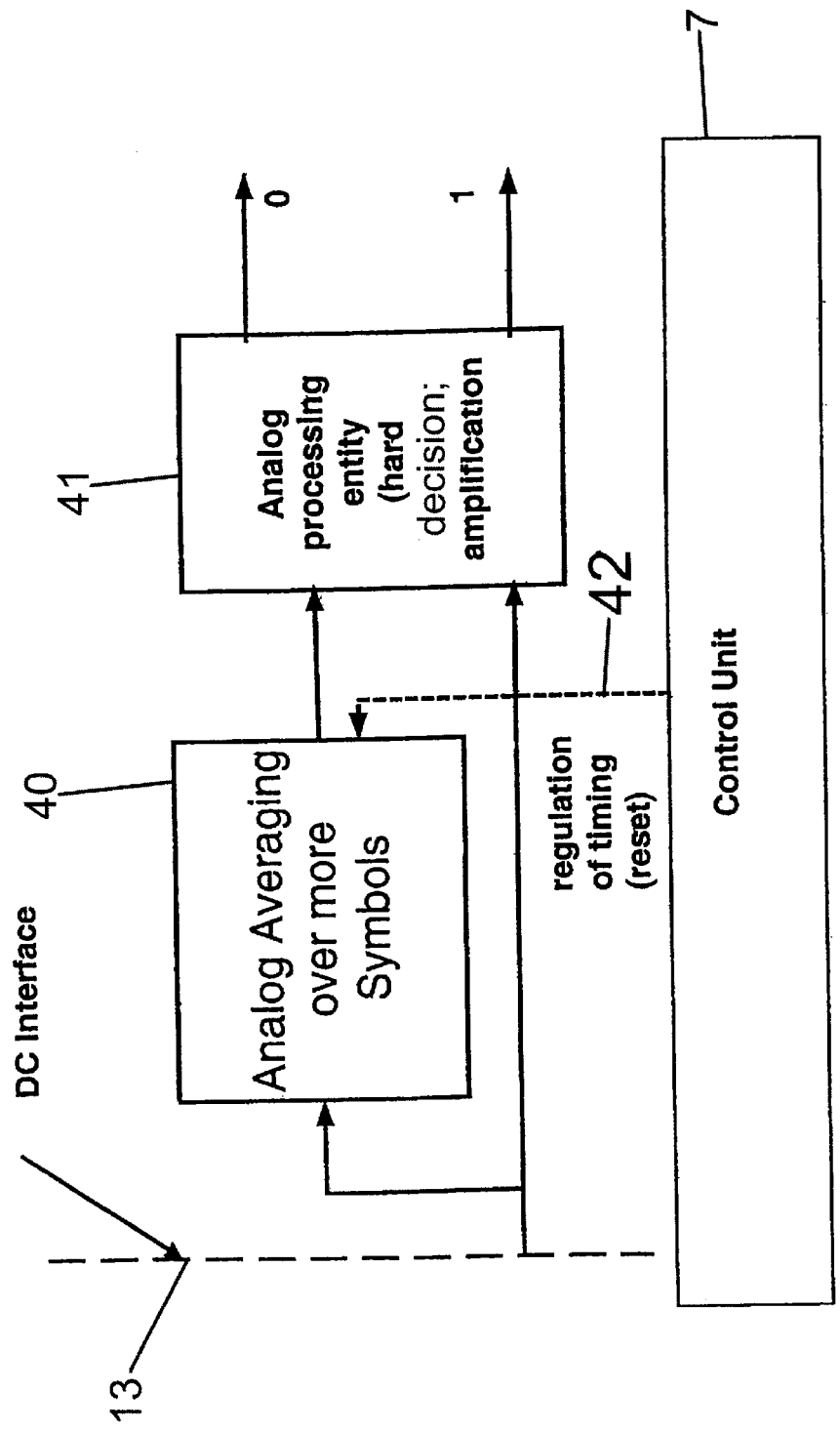
Figure 7:
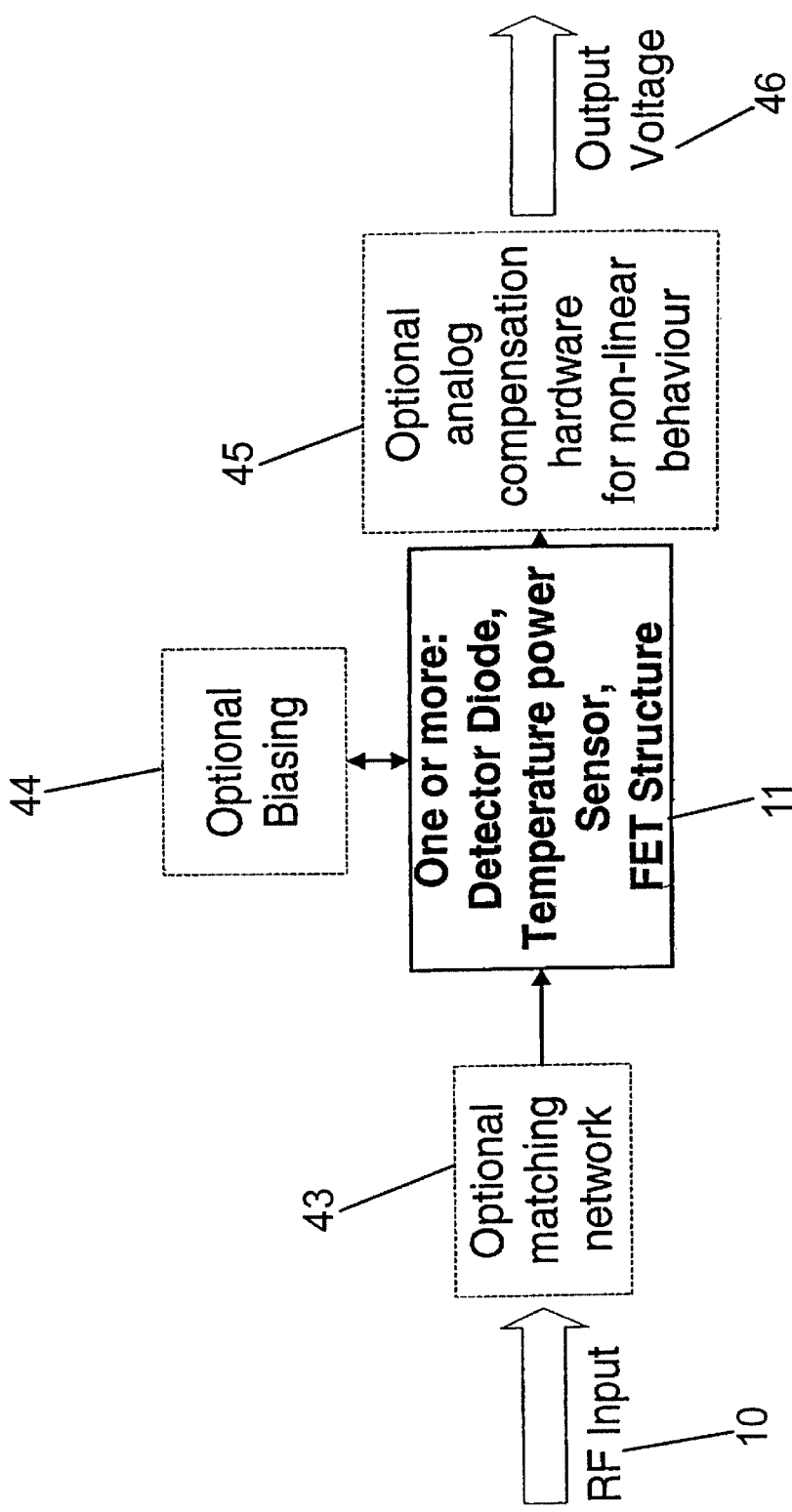
Figure 8:
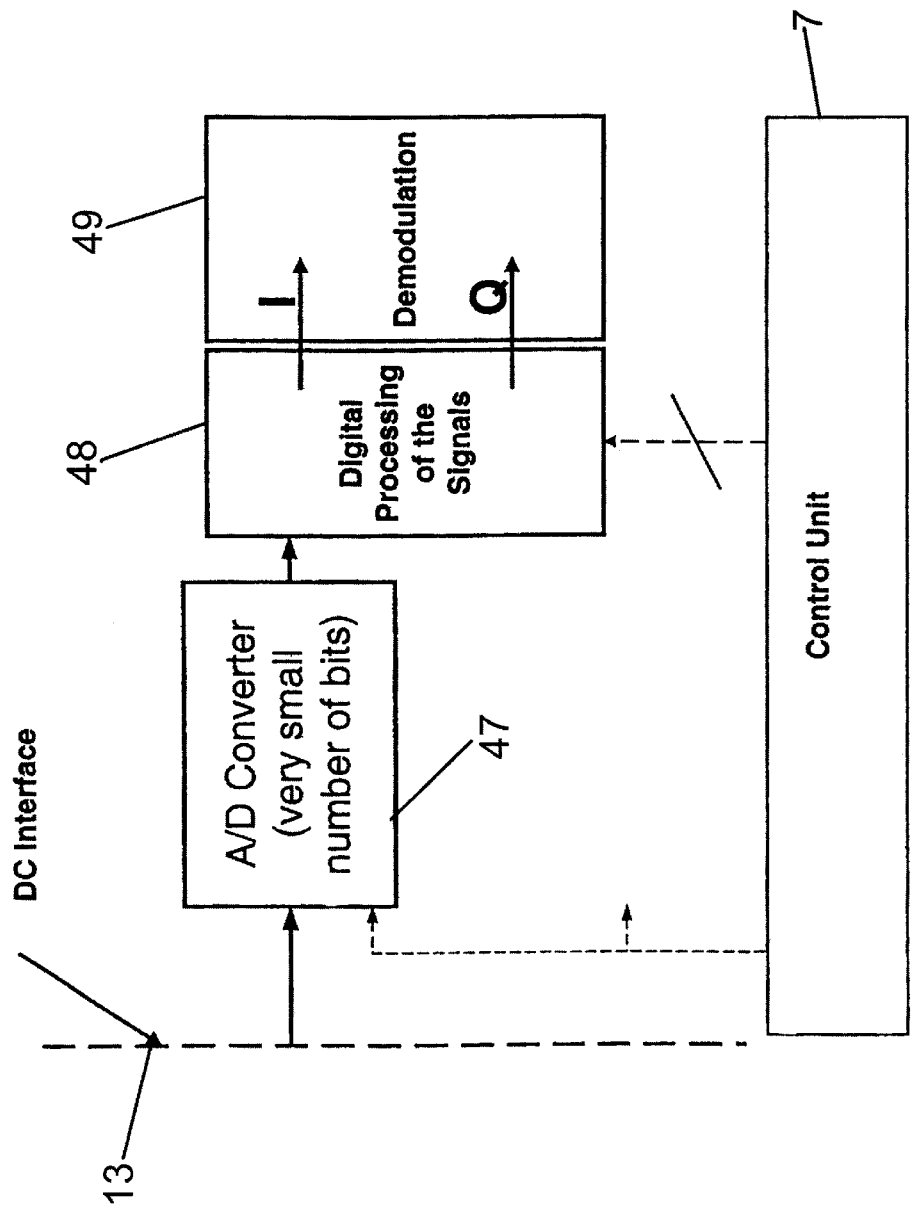
Figure 9:
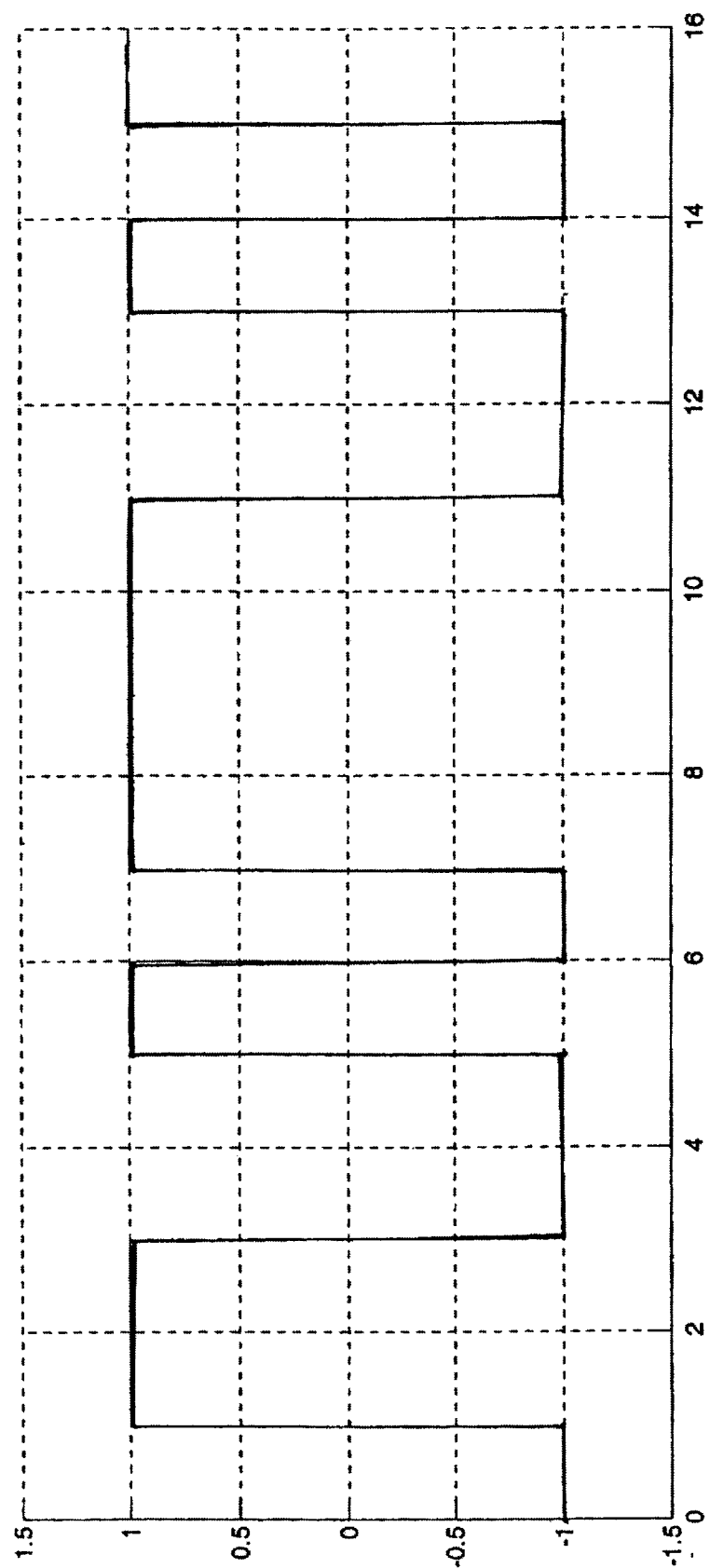
Figure 10A:
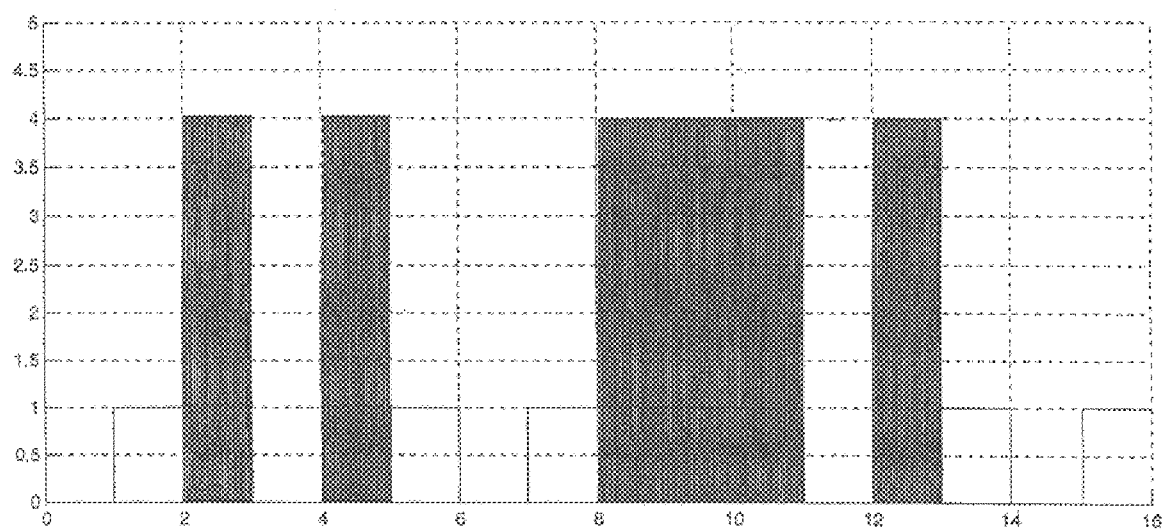
Figure 10B:
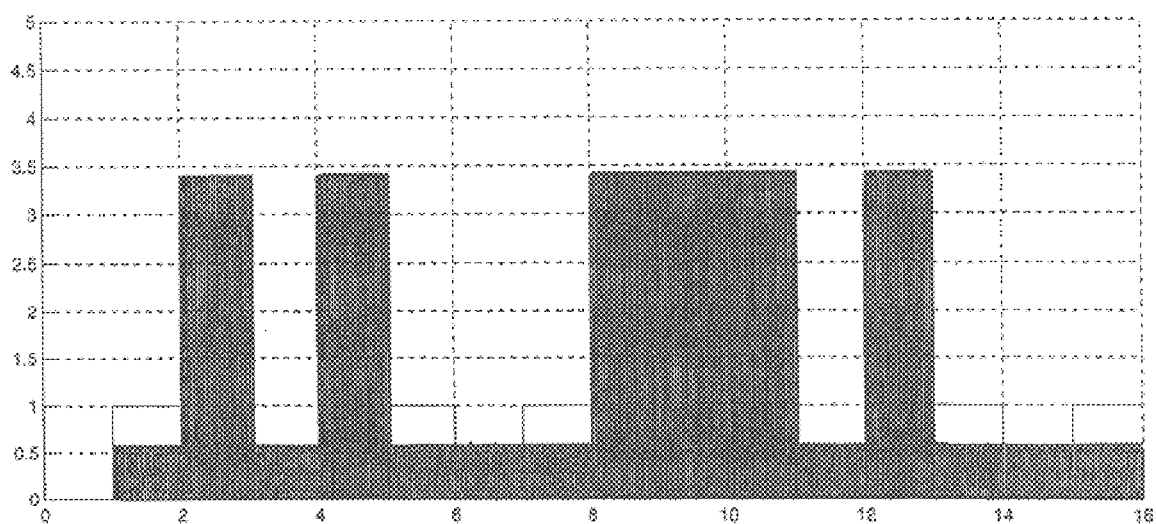
Figure 10C:
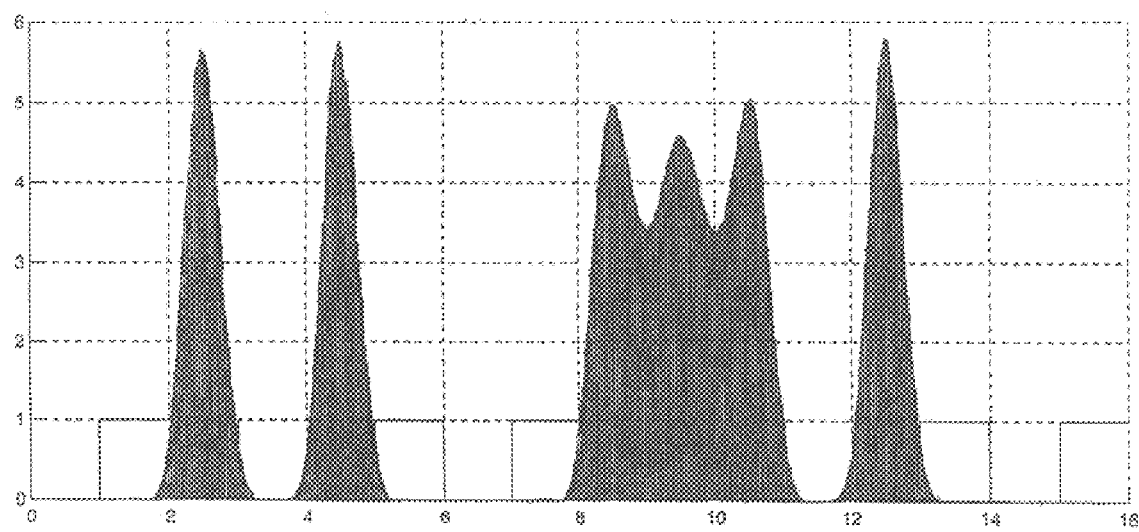
Figure 10D:
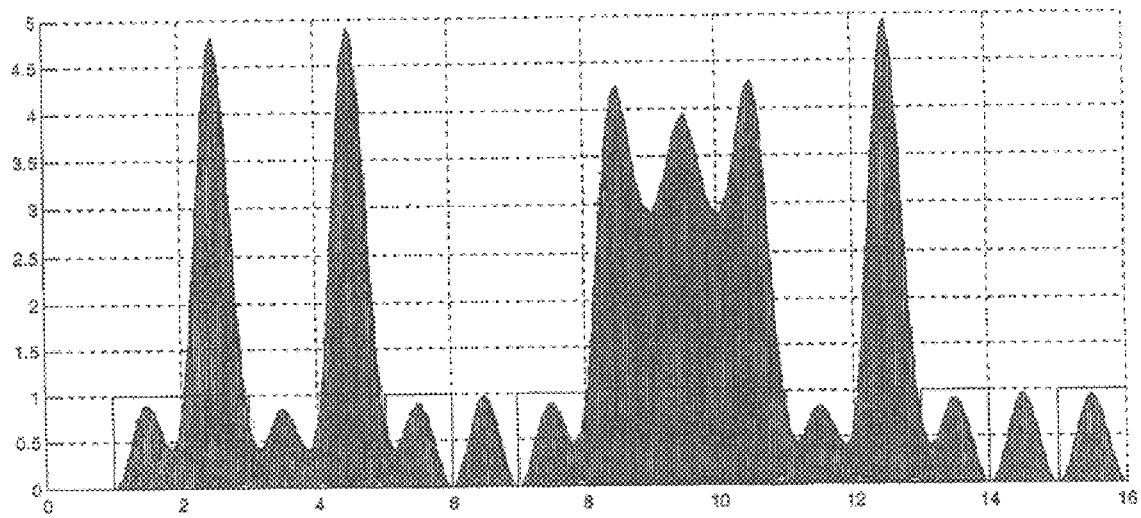
Figure 11A:
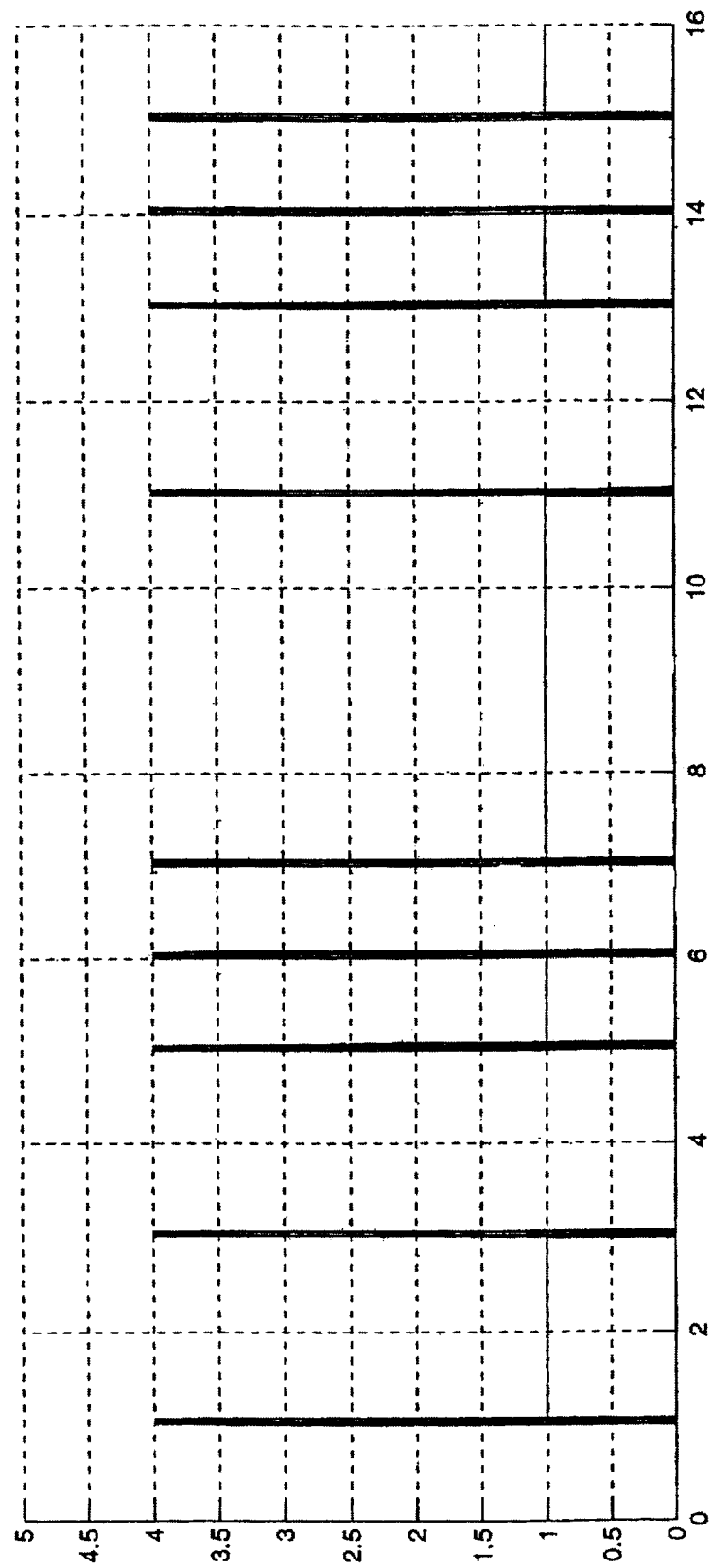
Figure 11B:
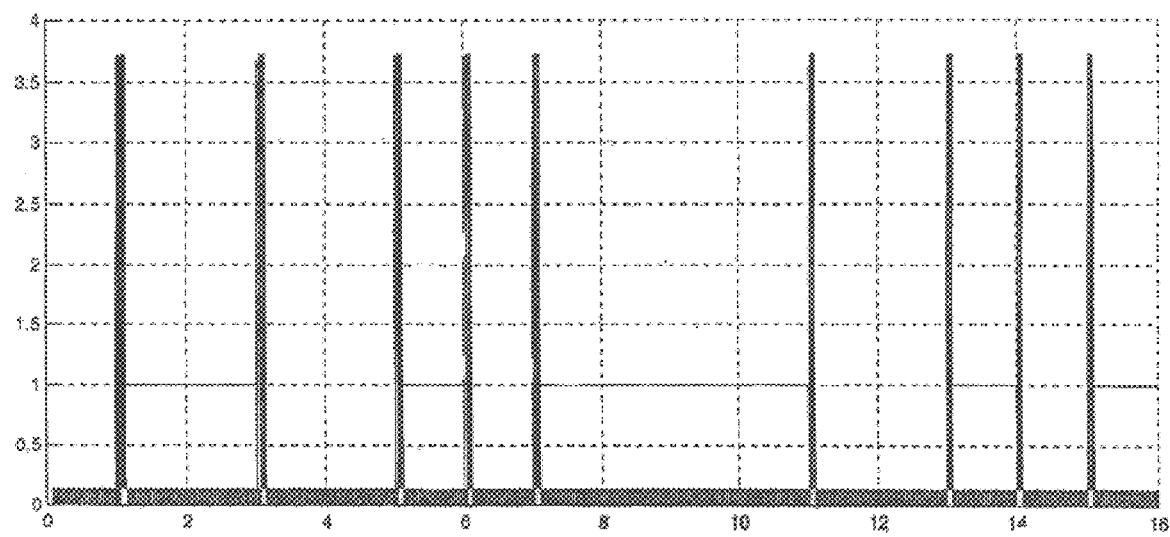
Figure 11C:
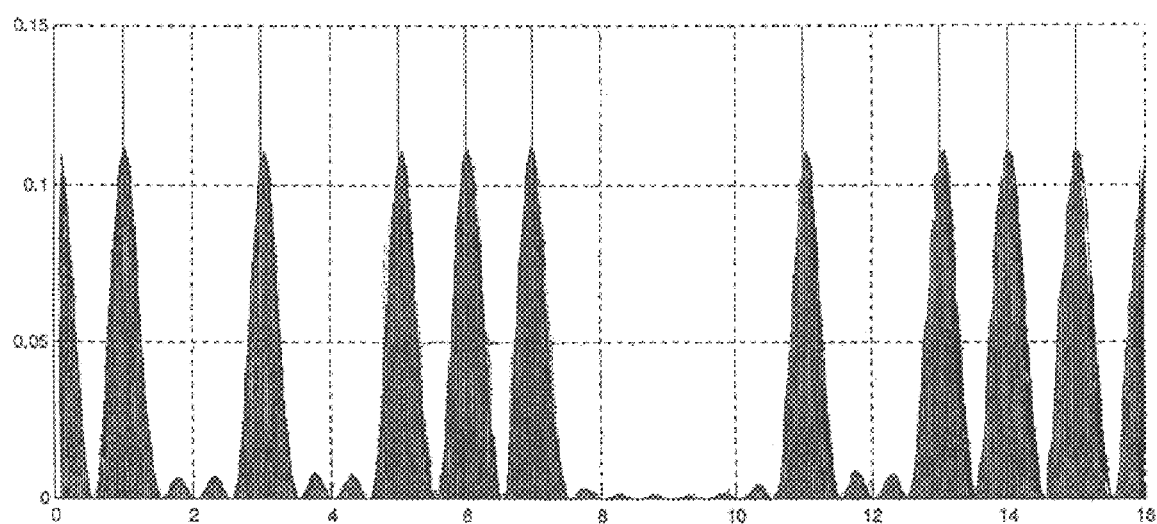
Figure 11D:
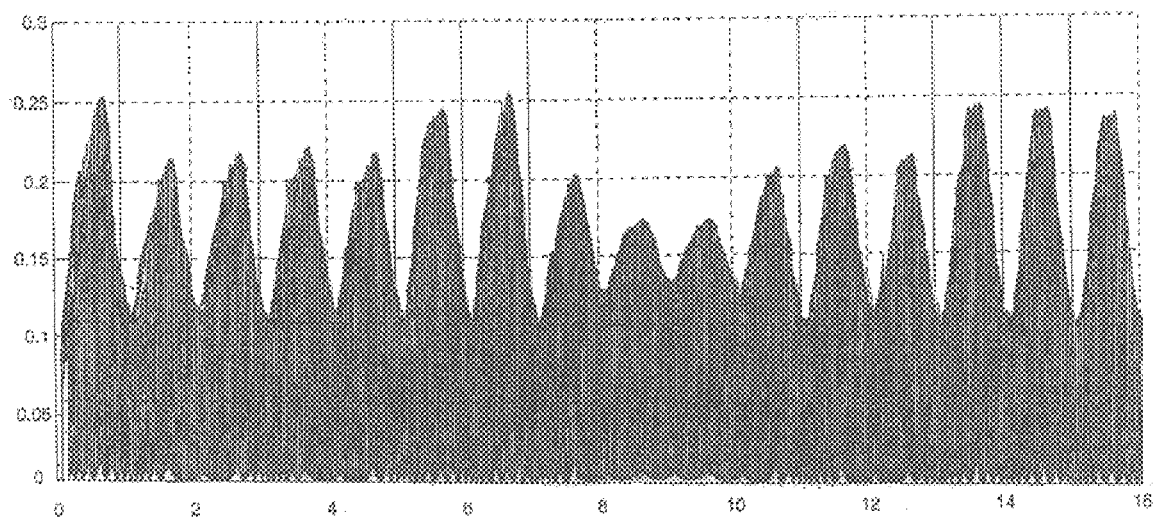

FIG. 5 shows the application of the present invention to a transceiver structure, FIG. 6 shows the analogue processing connected to the DC-interface following the downconverter/demodulator, FIG. 7 shows sub-parts of the power-sensor functional block FIG. 8 shows a digital processing connected to the DC-interface, FIG. 9 shows a test bit sequence used for a simulation, FIG. 10a shows a signal sensed at the output of the power sensor when using the embodiment of FIG. 3a, FIG. 10b shows the signal output by the power sensor when using the structure according to the FIG. 3a according to another scenario, FIG. 10c shows the signal output by the power sensor in case of using the structure of FIG. 3a according to a still further scenario, FIG. 10d shows a further simulation for the signal output by the power sensor when using the structure of FIG. 3a FIG. 11a shows a still further simulation of the signal output by the power sensor when using the structure according to FIG. 3a, FIG. 11b shows a further simulation for the signal output by the power sensor when using the structure of FIG. 3a, FIG. 11c shows a still further simulation for the signal output by the power sensor when using the structure of FIG. 3a, and FIG. 11d shows another simulation for the signal output by the power sensor when using the structure of FIG. 3a.

The present invention proposes a solution for example for a 60 GHz system air interface comprising a direct downconversion and demodulation device. Furthermore a method of operation of the proposed downconversion and demodulating device is proposed. The demodulator device as proposed may have two or three ports and only one power detector instead of downconversion blocks known from the prior art. Therefore, the proposed concept is particularly advantageous for low-cost applications in the 60 GHz range.

The structure according to the invention can function as a direct receiver for very simple modulation schemes such as differential PSK and BPSK. It is particularly suitable for very high data rate short range communication systems in the millimeter-wave range, where the channel bandwidths are preferably larger than 100 MHz. The complexity of the system is may be smaller by increasing the operation bandwidth, so that bandwidths larger then 1 GHz or even 2 GHz may be easily accommodated.

Figure 1:
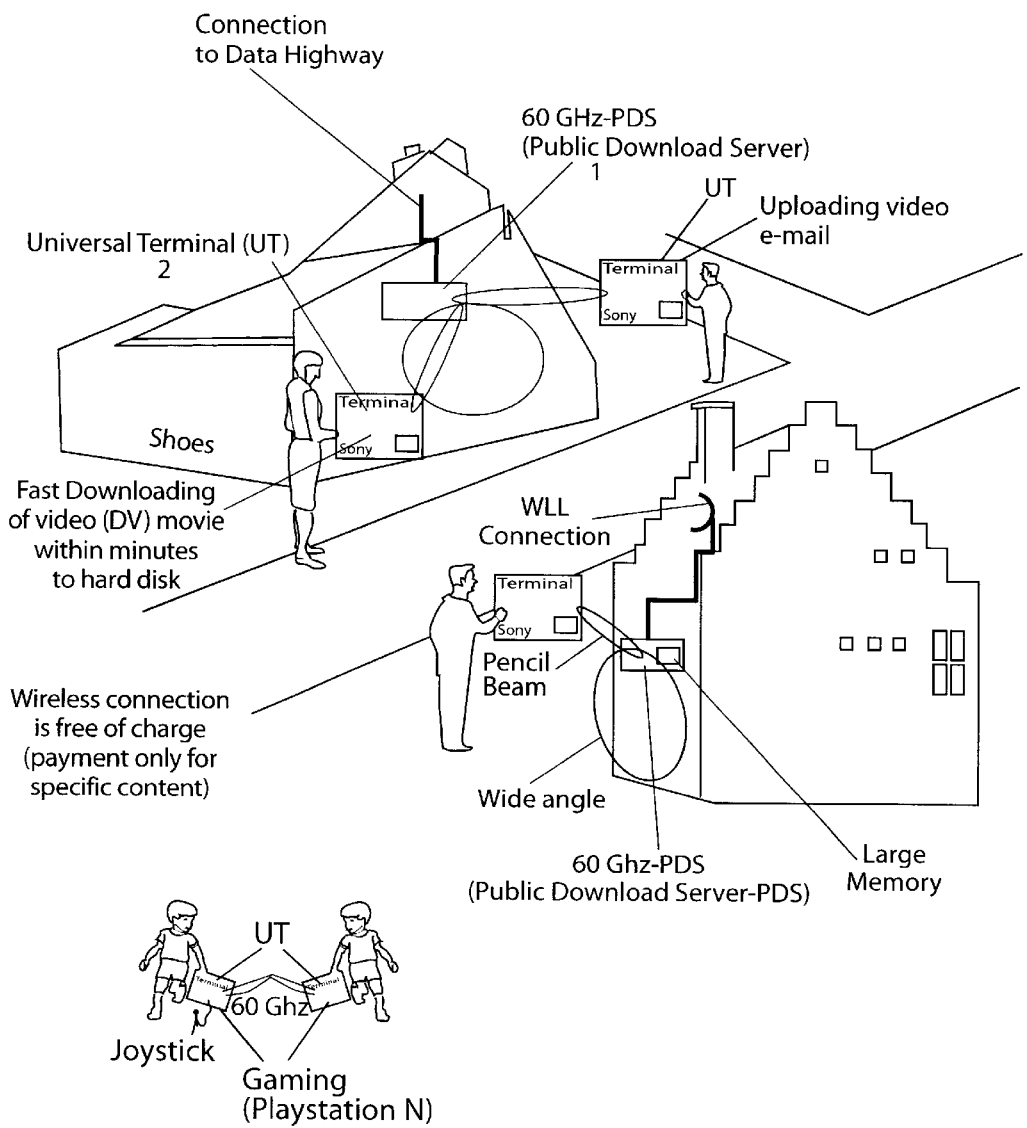
FIG. 1 shows a possible system application scenario.

With reference to FIG. 1, a typical application scenario of a public download system comprising a public download server 1 and a universal terminal 2 will now be explained. A typical cell is shown where only one public download server 1 having an omnidirectional antenna covers a small cell and more than one universal terminal 2 having a high-gain antenna is directed and connected to the public download server 1. Due to the small cell dimensions and the large attenuation in the 60 GHz frequency range, the universal terminal 2 as well as the public download server 1 should be kept as simple as possible.

Therefore, a single-frequency usage is proposed, where all cells in the 60 GHz frequency range of the known system are transceiving at the same frequency. All of the public download servers (PDS) 1 and all of the universal terminals (UT) 2 may work, for example, in a range of 59–64 GHz.

The system can use a TDMA access scheme and the modulation can be a BPSK scheme or alternatively a nPSK scheme. The channel bandwidth is preferably larger than 200 MHz and ideally larger than 1 GHz and can be increased up to the border of the locally assigned 60 GHz unlicensed band (e.g. 5–6 GHz band maximum).

Different types of channels can be used, such as, for example, a ultra low-cost terminal capable only of receiving 60 GHz high data-rate signals (only download). Alternatively, low-cost terminals capable of receiving and transmitting 60 GHZ high data-rate signals (download and upload) can be used.

Figure 2:
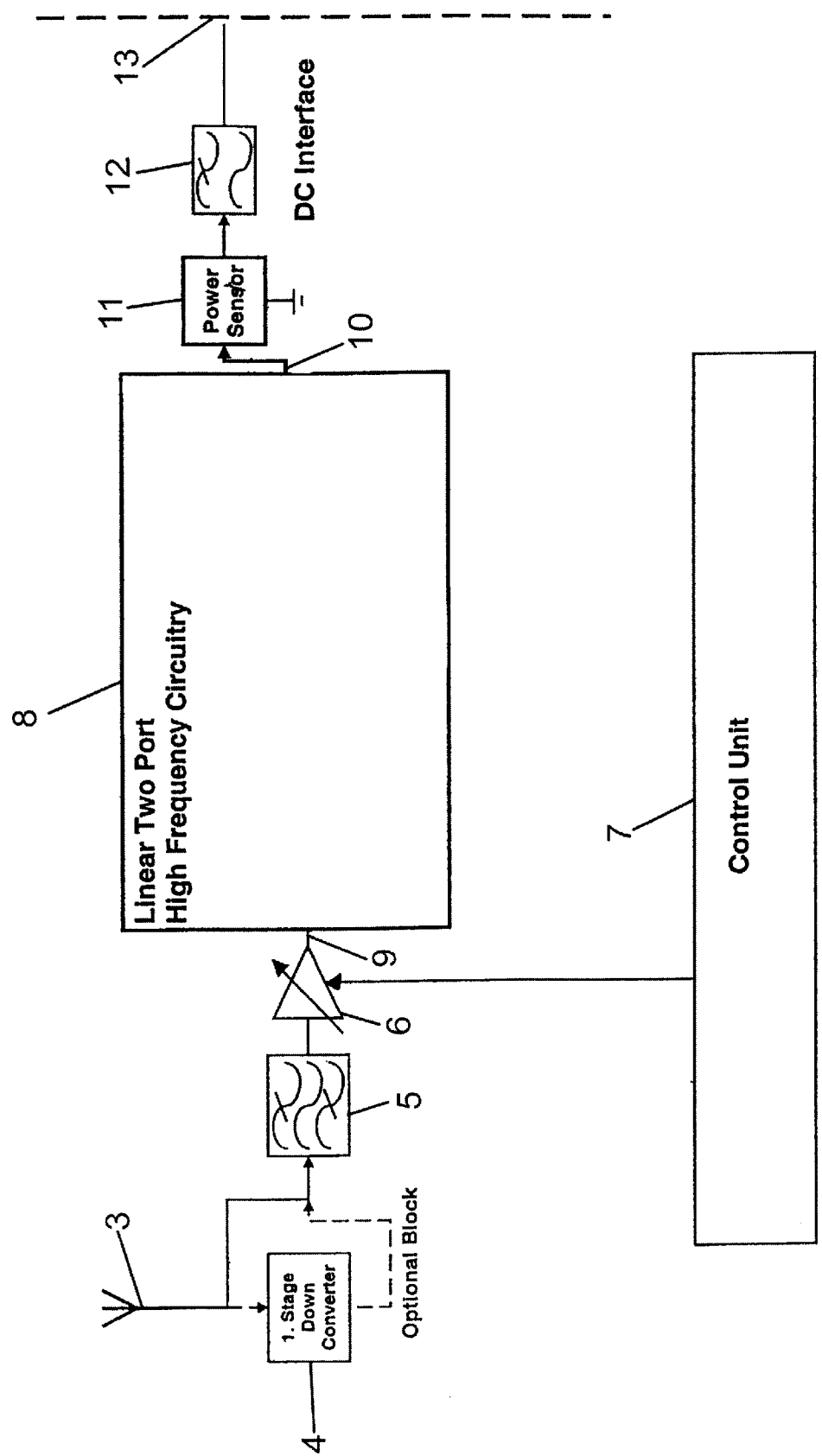
FIG. 2 shows the basic functional blocks of the proposed receiver and/or downconverter structure.

FIG. 2 shows the basic topology of a proposed low-cost two-port junction receiver. The central element of this receiver is a linear two-port 8 having one RF-input 9 and one RF-output 10 connected to a power sensor 11 detecting the power of the output signal supplied at the output 10 of the linear two-port 8. Note that the linear two-port 8 does not comprise a mixer and therefore no non-linear element providing the mixing process.

The modulated RF signal to be downconverted and demodulated is received at an antenna 3 and can be optionally passed through a first stage downconverter 4 before being bandpass filtered. The bandpass filtered output signal of the filter means 5 can be optionally passed through a AGC with an amplifier 6. Before being supplied to the input 9 of the linear two-port 8.

Note that the internal structure of the linear two-port 8 will be explained later on in detail. The linear two-port 8 supplies an output signal at an output 10. The sensed power signal then supplied from the power sensor 11 to a low-pass filter 12 and then to DC-interface 13. The analogue and/or digital circuitry attached to the DC-interface 13 will be explained in detail later on.

The proposed two-port-topology as shown in FIG. 2 therefore comprises a single RF-input, a single power detector, a single DC-output, inherently active and passive transmission elements and no mixing circuitry.

With reference to FIG. 3a, the internal structure of the linear two-port 8 will now be explained. The RF signal to be downconverted is supplied to the input 9 of the linear two-port 8. A RF signal splitting unit 14 splits the supplied RF signal into two branches. The first branch 18 is directly supplied to the first input of the three-port junction device 21 and the second branch is up-generated by the RF signal splitting unit is optionally passed through a switch 15 and then through a processing means before being supplied to a second input 19 of the three-port junction device 21.

In the example of FIG. 3a, the processing means of the second signal branch comprises a delay line 16 and optionally an amplifier 17. The delay provided by the delay line 16 corresponds to the equivalent of an integer multiple of one half of the carrier wave length of the RF signal to be downconverted.

According to an alternative the delay provided by the delay line 16 corresponds to the time duration of one or more modulation bits of the RF signal to be downconverted.

It is to be noted that according to the structure of FIG. 3a, no local oscillator is necessary for the downconversion process.

In case the switch 15 is present and is in its open (interrupted) state, only the first signal branch generated by the RF signal splitting unit 14 and therefore the RF signal to be downconverted and supplied to the input 9 of the linear two-port 8 is supplied to the first input of the three-port junction device 21. As will be explained later on, in this open (interrupted) state of the switch 15, the power of the RF.-signal to be downconverted can be calculated for demodulation purposes by an analog and/or gigital processing unit.

Figure 3B:
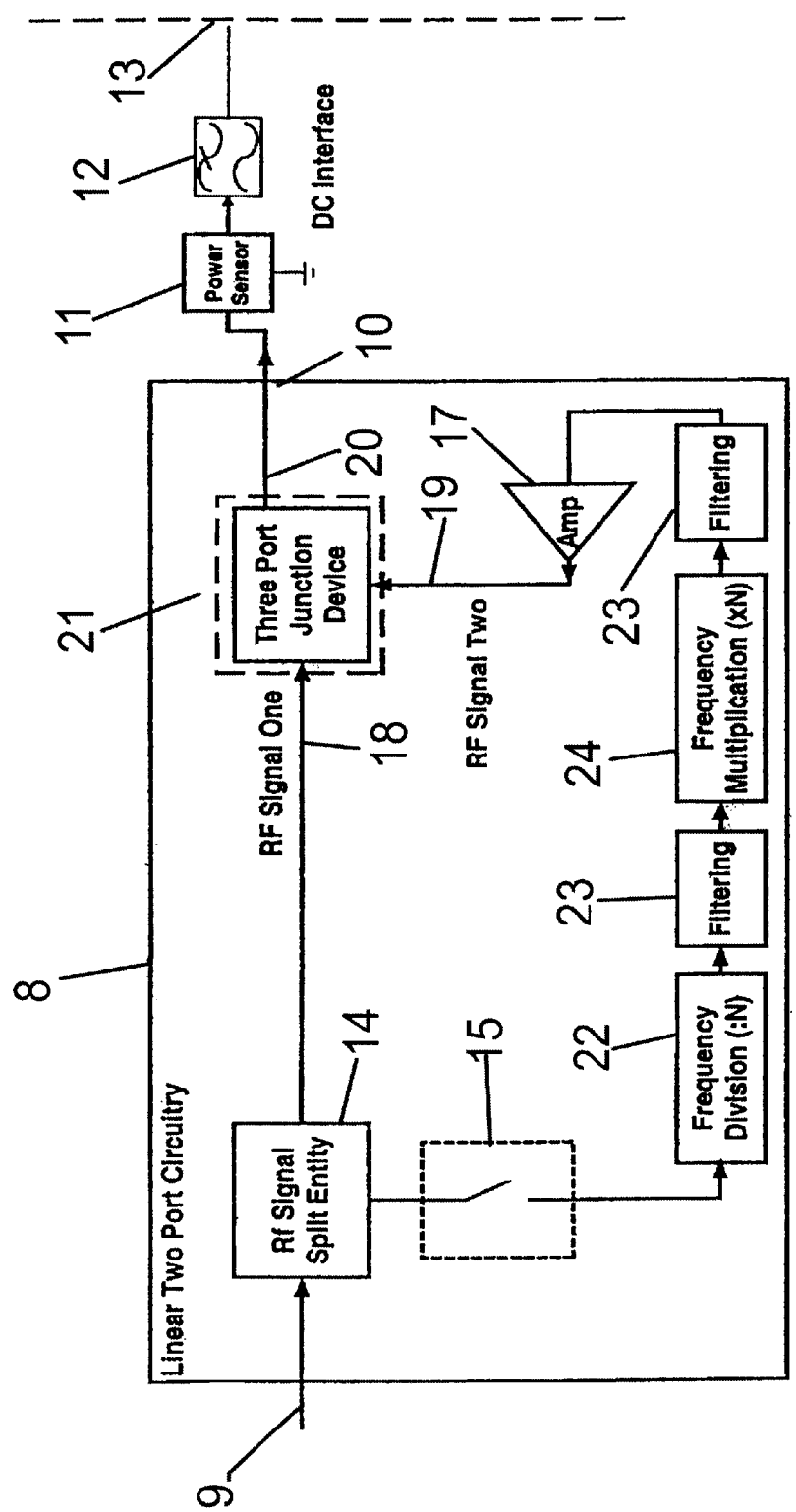
FIG. 3b shows a second option for a linear two-port circuitry.

FIG. 3b shows a further embodiment for the internal structure of the linear two-port 8. According to this embodiment the processing means for the second branch generated by the RF signal splitting unit 14 comprises a frequency division unit 22, a first filter-unit 23, a frequency multiplication unit 24, a further filter unit 23 as well as an amplifier 17. Note that the division factor N of the frequency division unit 22 is equal to the multiplication factor N of the frequency multiplication unit 24. By means of the frequency division, the first filtering, the frequency multiplication as well as the further filtering, which corresponds to a downconversion with a following up-conversion, the phase information of the RF signal to be downconverted is destroyed and the pure carrier frequency signal is extracted.

The filter units 23 are preferably band pass filters for eliminating unwanted harmonics which can arise due to non-linear characteristics of the frequency multiplication and/or frequency division.

Note that according to the embodiment of FIG. 3b, no local oscillator is necessary.

Figure 3C:
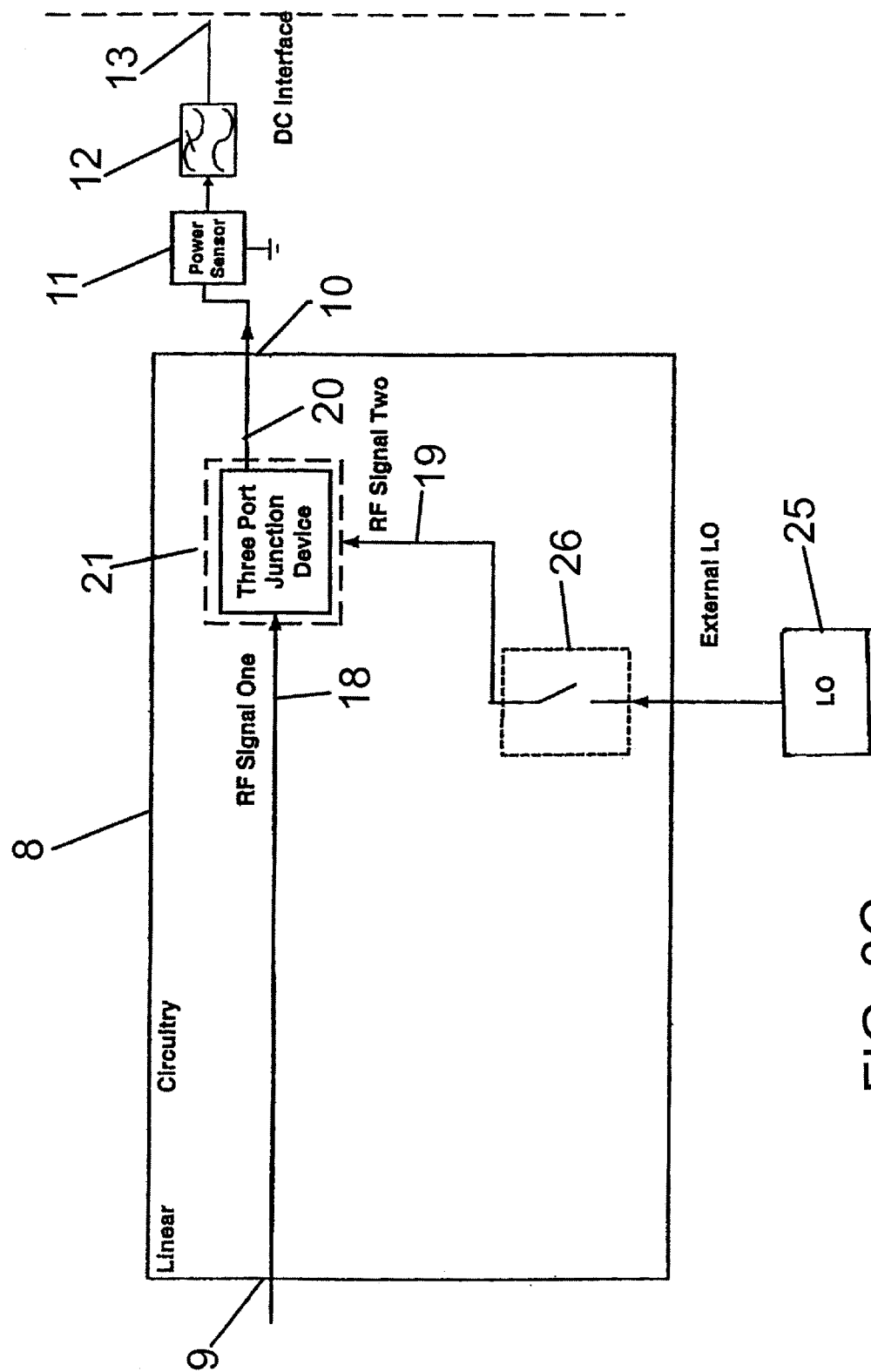
FIG. 3c shows a third option of a linear circuitry.

FIG. 3c shows a still further embodiment of the present invention. According to this embodiment, an external local oscillator 25 generating a signal with a frequency corresponding to the carrier frequency of the RF signal to be downconverted is input to the linear circuitry 8 and is the optionally passed through a switch 26 before being supplied to the second input 19 of the three-port junction device 21 of the linear circuitry 8. According to this embodiment, no RF signal splitting unit is necessary.

Figure 4:
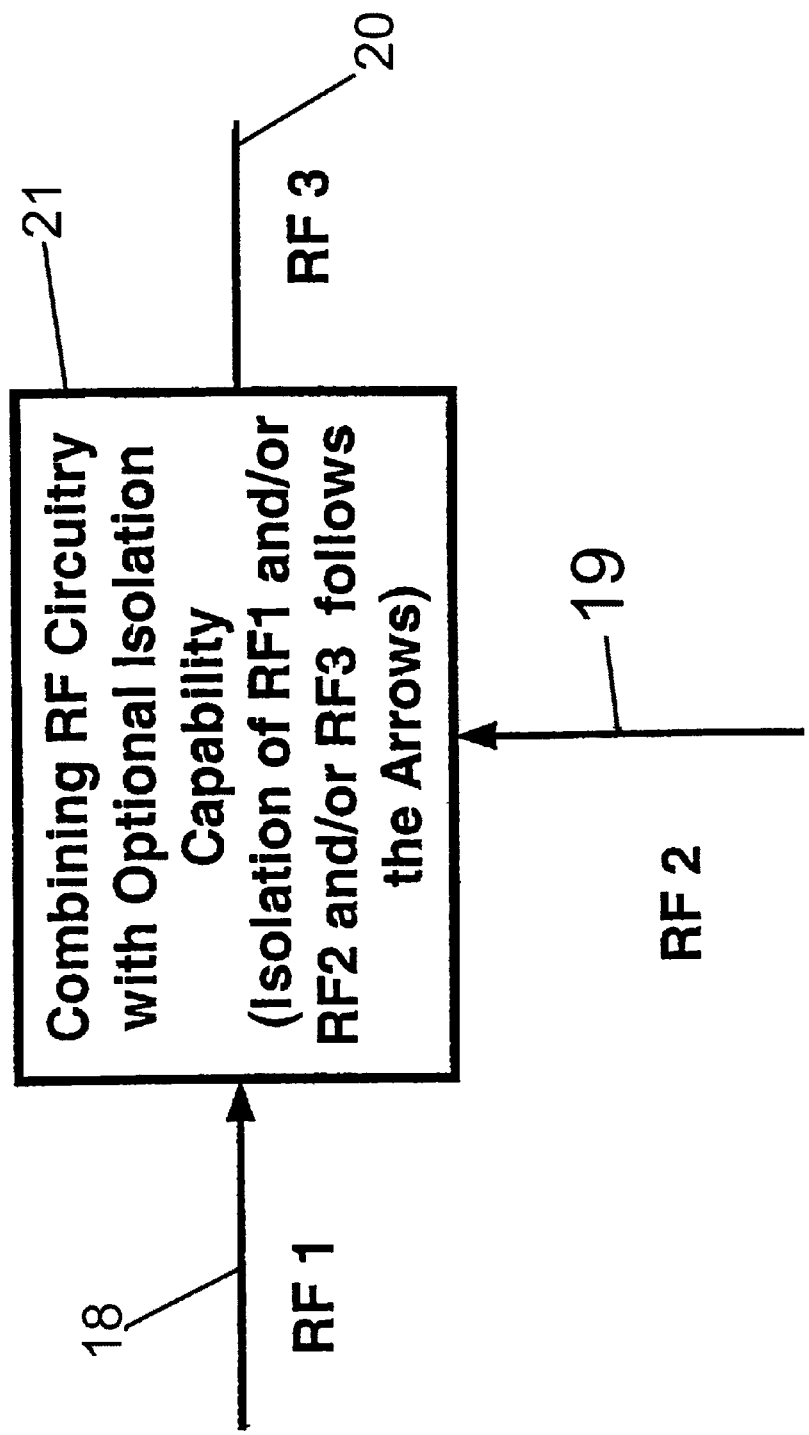
FIG. 4 shows a functional description of a three-port junction device.

FIG. 4 shows a schematic representation of the three-port junction device 21. It combines the two input RF signals having the same (carrier) frequency to the single output 20. Optionally, an isolation functionality according to the arrows shown in FIG. 4 can be provided at at least one of the three ports of the device 21. For further details regarding the three-port device reference is made to EP 101 1204 A1.

FIG. 5 shows the application of the present invention to a transceiver. The transceiver comprises a downconverting device according to FIG. 3c comprising a local oscillator 27, an optional switch 26, the three-port junction device 21, the power sensor 11 and a low-pass filter 12. The output signal of the low-pass filter 12 can be passed through analogue and digital processing blocks 36, 37 to an optional RS (Read Salomon)-coding processing block 38 generating the demodulated and decoded datastream 19.

On the other hand, the data stream 39 to be transmitted can be supplied to the RS-encoding processing block 38 and to the digital processing block 37 before being supplied to a direct LO-modulation block 28. During transmission, the switch 26 is in a state such that the LO-signal from the LO 27 is supplied to the direct LO-modulation block 28 modulating the coded and digitally processed data from the data stream 39 on the LO frequency. The output signal of the direct LO modulation block 28 is supplied to an amplifier 29, to an optional isolator 30, to a TX/RX switch 31, and to a filter 32 before it is transmitted by means of an antenna 33.

During reception, the received RF modulated RF signal from the transmitting antenna 33 and/or an additional reception antenna 35 is passed through an amplifier 34 before being supplied to the second input port of the three-port junction device 21.

The transceiver is shown in FIG. 5, therefore comprises a single LO source, a single power detector, RF amplifiers, linear active and passive transmission elements. However, no classic mixes circuitry (non-linear element used for mixing processes) is necessary.

FIG. 6 shows an analogue processing block which can be attached to the DC interface 13. It comprises an analogues averaging block 40 averaging a branch of the DC signals supplied to the DC interface 13 over several symbols. The DC signal as well as the average signal output by the analogue averaging block 40 is then supplied to an analogue processing entity 41 performing an hot decision process. Finally the modulation states are output by the analogue processing entity 41. The regulation of the timing for the analogue averaging block 40 is performed by means of a control signal 42 output by a control unit 7.

FIG. 7 shown schematically the structure of a power sensor 11. The RF input signal 10 can be passed through an optional matching network 43 before being supplied to the power sensor 11 which can comprise one or more detector diodes, a temperature power sensor and/or a FET structure. Optionally it can be connected to a biasing unit 44. The output signal of the power sensor is optionally passed through an analogue compensation hardware compensating for a non-linear behaviour 45 of the power sensor 11. Finally the output voltage 46 being proportional to the power of the RF input signal 10 is output.

FIG. 8 shows an example for a digital processing unit which can be attached to the DC interface 13. In this case the supplied DC signal is a/d converted 47 before being supplied to digital processing block 48 which supplied I/Q values to a demodulation block 49. The digital processing unit 48 can be controlled by means of the control unit 7.

Method of Operation

With reference particularly to FIGS. 2, 3a, 3b, a direct down-converter has been explained. The incoming modulated RF signal is amplified and split by the RF power splitter which can be realized by different implementations. Note that the splitting ration is not necessarily 50%. The modulated RF signal can be splitted in two different RF branches having different powers. One branch (preferably this with smaller RF signal) is approaching directly a three port device structure.

According to the FIG. 3a) the RF signal is passing through delay line having delay time. There are basically two options:
  a) a delay line with duration equal to the duration of the bit symbol.
  b) a delay line with duration of at least one half of the wave length (carrier frequencies) or its multiples.

In order to compensate different signal strengths of the two split signals, one or more (also within delay line) RF amplifiers may be provided, particularly in the case of option a). This signal is then fed to the second input port of the three port device. In the three port device two RF signal with different phases are added(combined) as a vectors. The signal of the resultant vector magnitude representing the result of the combination is supplied to the power detector attached to the output of the three port device. It is additionally low pass filtered and provided further to an analog and/or digital processing structure. The analog processing structure (FIG. 6) defines a threshold as the average power by means of the averaging block and by a hard decision procedure generating the demodulation bits. the demodulation bits can be further optionally RS decoded and provided to further processing.

In the FIG. 3b, the signal is divided and further unconverted in order to extract the carrier and destroy phase information. In that case structure is more complex, needs nonlinear elements for frequency dividing/frequency up-conversion, and additional filter structures. Loss of the gain is compensated by the additional amplification.

The essential difference of the approach is that instead of the delay line (which may be long and take a lot of space), space may be minimized by the embidiment using the multiplying and frequency division process. The common point of these two embodiments is that in both cases there no external LO source is necessary. Secondly, and according to the principle of the detection of the power detector: the error margins (threshold distance to the minimum an maximum values in the hard decision process, see EP 1011204 A1) is optimal if the signals (RF 1, RF2) supplied to the three port junction have approximately equal or similar signal strengths. By having different communication distances the power of the RF signal supplied to the power splitter can vary, but nevertheless in both cases the signal strengths RF1 and signal strength RF2 generated by the power splitter will have relatively one to another constant ratio which is advantageous for the whole operation.

Therefore theoretically no AGC circuitry is required if the sensitivity requirements of the related components and sensitivity of the power sensor itself is good enough. In practical realization, however some mean of the simple slow AGC controlling by analog feedback may be realized.

It is also important to discuss the two different options by applying delayed modulated signal with delay of one bit and delay on one half (or multiply of one half) wave length of the carrier frequency. The examples of the FIGS. 10(a,b,c,d) and FIGS. 11(a,b,c,d) show that the detection in case the delay is equal to one bit duration is much more easier as the requirements on the power sensor are lower.

In case the delay is equal of one half wave length delay charging ("raising on" time) has to be as smaller as possible. Moreover in the case of the FIGS. 10d and 11d, the detection sensitivity of the delay line length tolerances is different. A delay line with a delay of one modulation bit may cope with tolerances of around 15% of the carrier wavelength, versus around 3% in case when delay is one half (or multiply of one half) wave length of the carrier frequency.

Looking at case 1 (Table I): from the prospective of the power sensor design, the design efforts and general requirements are lower, but on the other hand a one bit duration delay line needs a lot of efforts and possibly additional power amplifier to compensate for propagation losses.

In the FIG. 3c case however external LO signal having the same carrier frequency like modulated RF signal is applied directly to the three port device port. The disadvantage is that a gain control for the RF signal (or LO signal) is required in order to have approximately similar strengths at the inputs of the three port device.

The terminal of the type B may have a functionality also to send a data and therefore a transceiver structure is proposed. It is 50% based on receiver structure described in FIG. 3c, with additional components required for generation modulated RF signal ready to be transmitted. The control unit defines the receiving and transmitting modes, by enabling functionality, and by controlling RX/TX switches and LO switch path.

Due to proposed modulation scheme, BPSK or 4PSK it is possible to achieve direct modulation of the LO source without up and down covering steps. This may be advantageous due to simplicity of the approach and direct usage the same LO without any frequency tuning for both receiving and transmitting path.

In the following equations (1) to (7) a simplified general mathematical description of the proposed down conversion method.

Table 1 shows the legend of the used variables.

$$v_1 = \rho V_0 e^{j\varphi} \quad (1)$$

$$v_2 = V_0 \quad (2)$$

$$v = \frac{v_1}{v_2} = \rho e^{j\varphi} \quad I = \rho\cos\varphi \quad Q = \rho\sin\varphi \quad (3)$$

$$v_3 = s_{31}v_1 + s_{32}v_2 = k_{31}e^{j\theta_{31}}\rho e^{j\varphi}v_2 + k_{32}e^{j\theta_{32}}v_2 \quad (4)$$

$$v_3 = (k_{31}\rho e^{j(\theta_{31}-\theta_{32}+\varphi)} + k_{32})v_2 e^{j\theta_{32}} \quad (5)$$

$$P_3 = P_2(k_{31}^2\rho^2 + k_{32}^2 + 2k_{31}k_{32}\rho\cos(\theta_{31}-\theta_{32}+\varphi)) \quad (6)$$

$$\overline{P_3} = \frac{1}{N}\sum_1^N P_3 \quad (7)$$

$v_1$ RF signal to be 1/Q demodulated
$v_2$ Second RF signal (known)
$\rho$ magnitude ratio between RF signal one and two
$\varphi$ phase difference between RF signal one and two
$s_{mn}$ complex transfer function from port n to m
$k_{mn}$ magnitude of the complex transfer function from port n to m
$\theta_{mn}$ phase of the complex transfer function from port n to m
$v_3$ signal which approaches power sensor
P3 Power level detected at power sensor
P3 Averaged Power level detected at power sensor after N signals Table 1. Legend of used Variables Following expression (6) we may see mathematical (stable condition) value of the signal appearing at the output of the power detector. Taking account of the BPSK modulation (using system of FIG. 3a) we may have two possible cases
  P3(0); when relative phase difference between two bits are zero
  P3(1); when relative phase difference between two bits are 180 degrees We have respectively (if $\theta_{31}=\theta_{32}$):

$$P3(0)=c_1+c_2* \cos(0)=c_1+c_2, \quad (8)$$

and $$P3(0)=c_1+c_2* \cos(\pi)=c_1-c_2 \quad (9)$$

By setting threshold by the $c_1$ (to be obtained by analog averaging of the incoming signal) we may perform simply hard decision only using analog means. By simple sampling (1 bit) we may have a binary information ready for further processing, like for example optional Reed-Salomon decoding.

Estimation of the possible RF Parameters
 (Example of the proposed approach)

CASE 1

Case of FIGS. 2, 3a is considered with transmission chain of FIG. 5. In the case when delay line has a length large enough to cover one modulation bit delay.

| Transmitter | |
|---|---|
| Operating frequency | 61 GHz |
| LO level (−15 dB) | −15 dB |
| Channel Bandwidth | 2 GHz |
| Bias Pin diode based Bi-Phase direct modulator | 6 dB losses |
| Power Block Stage Gain | 40 dB |
| Output RF filter loss | 5 dB |
| Total Switch loss | 8 dB |
| Output RF power | 10 dB |
| TX antenna Gain (180 degree) high gain antenna | 8 dB |
| Output Back -Off | 3 dB (PA 1 dB Compression at 13 dB) |
| LO Stability | TBD (not critical) |
| Receiver | |
| Communication range | 6 meter |
| Attenuation Level (path loss) | 84 dB |
| Receiving Signal level at antenna | −66 dBm |
| Receiving Antenna Gain (including pointing error of around +/− 5 degrees) | 15 dB |
| Noise Figure | 10 dB |
| Thermal Noise Level | −81 dB |
| Noise Figure Increase due to self-mixing | 3 dB |
| Signal level at LNA Block input | −51 |
| LNA + buffer Gain | 42 dB |
| Power Level before −10 dB coupler | −9 dB |
| RF1 power level. | −19 dB |
| RF2 power level at input of delay line | −9 dB |
| Actual Length of the delay line having $\epsilon_r$ of 40 Taking into account time delay of 1 ns - Effective wave propagation constant appr. 6 times slower than air - (1 bit BPSK delay at 2 GHz) | c. 5 cm |
| RF2 signal level after delay line | −39 dB |
| Gain Block of RF2 signal | c. 20 dB |
| RF1 and RF2 signal level at input of three port structure | −19 dB |
| Average signal level at the input of the power detector | Ideally between −30 and 0 dB |
| Average DC output level, before DC amplifier | Between 5 and 20 mV |
| System Implementation margin | 10 dB |
| Available S/N for BPSK | 7 dB If BPSK may be detected sufficiently well also with S/N of 4 dB The total range from 6 m may be extended to more than 12 m |

The proposed system can cope with a signal variation of around 30 dB without any analog AGC. Note if the maximum range is 10 meters, the system may work without AGC if receiver comes as close to public download server (according to FIG. 1) as far as 35 cm. This may be sufficient for public downloading. If even smaller distances are possible, some of the amplifiers (one or alternatively two) in the chain may be switched off, if there is no possibility to send a massage to remote transmitter to reduce the radiated power. Note that according to the specific application scenario channel properties are very good and there is no need for a fast AGC and complicated high speed equalization techniques.

CASE 2

The structure of FIGS. 2, 3a is considered together with a transmission chain according to FIG. 5. The delay line has a length large enough to cover one half of the electrical wavelength (180 electrical degrees delay).

| Transmitter | |
|---|---|
| Operating frequency | 61 GHz |
| LO level (−15 dB) | −15 dB |
| Channel Bandwidth | 2 GHz |
| Bias Pin diode based Bi-Phase direct modulator | 6 dB losses |
| Power Block Stage Gain | 40 dB |
| Output RF filter loss | 5 dB |
| Total Switch loss | 8 dB |
| Output RF power | 10 dB |
| TX antenna Gain (180 degree) high gain antenna | 8 dB |
| Output Back-Off | 3 dB (PA 1 dB Compression at 13 dB) |
| LO Stability | TBD (not critical) |
| Receiver | |
| Communication range | 6 meter |
| Attenuation Level (path loss) | 84 dB |
| Receiving Signal level at antenna | −66 dB |
| Receiving Antenna Gain (including pointing error of around +/− 5 degrees) | 15 dB |
| Noise Figure | 10 dB |
| Thermal Noise Level | −81 dB |
| Noise Figure Increase due to self-mixing | 3 dB |
| Signal level at LNA Block input | −51 |
| LNA + buffer Gain | 34 dB |
| RF1 power level (after splitting) | −23 dB |
| RF2 power level (after splitting) | −23 dB |
| Delay line coping with one half of the Wave length. | ... mm |
| RF1 and RF2 signal level at input of three port structure | c. −23 dB |
| Average signal level at the input of the power detector | Ideally between −30 and 0 dB |
| Average DC output level, before DC amplifier | Between 5 and 20 mV |
| System Implementation margin | 10 dB |
| Available S/N for BPSK | 7 dB If BPSK may be detected sufficiently well also with SIN of 4 dB The total range from 6 m may be extended to more than 12 m |

In the following simulation results for the application of the technology of the present invention will be explained:

FIG. 9 shows a testbit sequence which is used for a simulation.

FIG. 10a shows a signal at the power sensor output in case of using the structure according to FIG. 3a, wherein according to this simulation the delay provided by the delay line is equal to the symbol bit time duration and no TX or RX filtering of the 60 GHz is performed. The signal is „off" at the power detector as soon as changes in the bit sequence occur.

FIG. 10b shows a signal at the power sensor output in the case of using a structure of FIG. 3a, wherein the delay provided by the delay line is equal to the symbol bit duration (the delay error is equal to 12,5% of the carrier wave length). No TX or RX filtering of the 60 GHz signal is performed. The signal is „off" at the power detector when changes in the bit sequence occur. Then non-ideal delay line length has an influence similar to increasing the noise level.

FIG. 10c shows the signal at the power sensor output at the case of using a structure according to FIG. 3a, wherein the delay provided by the delay line is equal to a symbol bit duration and a filtering of the 60 GHz signal is performed (bandwidths filter of 4 GHz around the carrier frequency of 61.5 GHz). The signal is „off" at the power detector as soon as changes in the bit sequences occur. The filtering does not disturb the performance of the structure.

FIG. 10d shows the signal at the power sensor output in case of using a structure according to FIG. 3a, wherein the delay provided by the delay line is equal to the symbol bit duration (with a delay error corresponding to 12.5% of the carrier wave length). A filtering of the 60 GHz signal with a bandwidths filter of 4 GHz around a carrier frequency of 61.5 GHz is performed. The signal is „off" at the power detector when changes in the bit sequence occur. The filtering does not disturb the performance. The non-ideal delay line length does not influence similar to increasing the noise level. The consequence is that the delay may allow some significant tolerances in the their length (up to approximately 15% of the carrier wave length) and still a satisfactory performance can be achieved.

FIG. 11a shows the signal at the power sensor output in the case of the structure of FIG. 3a, wherein the delay line is equal to 5/2 of the carrier wave length. No TX or RX filtering of the 60 GHz signal is performed. The signal is „on" at the power detector when changes in the bit sequence occur.

FIG. 11b shows the signal at the power sensor output regarding the case of using a structure according to FIG. 3a, wherein the delay line is equal to 5/2 of the carrier wave length (with a delay error corresponding to 6.25% of the carrier wave length). No TX or RX filtering of the 60 GHz signal is performed. The signal is „on" at the power detector when changes in the bit sequence occur.

FIG. 11c shows the signal at the power sensor output in case of using a structure according to FIG. 3a, wherein the delay line equal to 5/2 of the carrier wave length is used. A TX or RX filtering of the 60 GHz with the bandwidths of 4 GHz around the carrier frequency of 61.5 GHz is performed. The signal is „on" at the power detector when changes in the bit sequence occur. Due to the required filtering it can be seen that the peak level is significantly smaller, which makes the detection of the peak inherently civvies.

FIG. 11d shows the signal at the power sensor output regarding the case of FIG. 3a, wherein the delay is equal to 5/2 of the carrier wave length and has an delay error corresponding to 6.25% of the carrier wave length. TX or RX filtering of the 60 GHz signal is performed by a bandwidths filter of 4 GHz around a carrier frequency of 61.5 GHz. The signal is „on" at the power detector when changes in the bit sequence occur. Due to the required filtering it can be seen that the peak level is significantly smaller, which makes the detection of the peak inherently civvies. Due to the additional mismatch on the delay lines the system may not be able to operate. A consequence is that the delay line has to have a tolerance less than 3% in relation to the carrier wave length.

What is claimed is:

1. Device for the down conversion of a modulated RF signal without mixing stage, comprising a linear two-port device having an input port for the RF signal to be down converted as well as an output port, and a single power sensor connected to the output port of the two-port device, wherein the linear two-port device comprises a three-port junction having two inputs and one output connected to the power sensor, one input of the three-port junction being supplied with the RF signal and the other input of the three-port junction being supplied without switching with a further RF signal originating from a local oscillator or with a further RF signal being derived from the RF signal to be down converted;

whereby frequency down conversion is performed by said three-port junction.

2. Device according to claim 1, characterized in that the linear two-port comprises a three-port junction with one output to the power sensor, a first input for the RF signal to be down converted and a second input for a RF signal branched off the RF signal to be down converted by means of a power splitter.

3. Device according to claim 2, characterized by a switch to selectively interrupt the branched off RF signal.

4. Device according to claim 3, characterized by a calculation unit for calculating the power of the RF signal to be down converted during a time period in which the switch is in an interrupt state.

5. Device according to claim 4, wherein the RF signal branched off the RF signal to be down converted is passed through a processing unit before being supplied to the second input of the three-port junction.

6. Device according to claim 5, characterized in that the processing unit comprises a delay unit.

7. Device according to claim 6, characterized in that the delay unit provides for a delay corresponding to the equivalent of an integer multiple of half the wavelength of the carrier frequency of the RF signal to be down converted.

8. Device according to claim 6, characterized in that the delay unit provides for a delay corresponding to an integer multiple of a modulation state time duration of the RF signal to be down converted.

9. Device according to claim 5, characterized in that the processing unit comprises frequency dividing and frequency multiplying means.

10. Device according to claim 1, characterized by an automatic gain control unit connected to the input of the linear two-port device.

11. Demodulator comprising a device according to claim 1, wherein an analog processing device is connected to the output of the power sensor to detect the modulation states of the RF signal.

12. Demodulator according to claim 11,
wherein the analog processing device comprises an averaging unit and a hard decision unit.

13. Demodulator according to claim 11, characterized in that
it is designed for the demodulation of a BPSK modulated RF signal.

14. Method for the down conversion of a RF signal without mixing stage, comprising the steps of:
supplying the RF signal to be down converted to a first input of a three-port junction and supplying the other input of the three-port junction with a further RF signal originating from a local oscillator without switching or being derived from the RF signal to be down converted, and,
sensing the power of the output signal supplied at the output port of the three-port junction;
whereby frequency down conversion is performed by said three-port junction.

15. Method according to claim 14, characterized in that
a further RF signal is branched off the RF signal to be down converted, processed and then supplied to an three-port junction combining it with the RF signal to be down converted.

16. Method to claim 15, characterized in that
the branched off RF signal can be selectively interrupted.

17. Method according to claim 16, characterized in that
the power of the RF signal to be down converted is calculated during a time period in which the branched off RF signal is interrupted.

18. Method according to claim 14, characterized in that
the step of processing comprises the step of delaying the branched off RF signal before supplying it to the three-port junction.

19. Method to claim 18, characterized in that
the delay corresponds to the equivalent of an integer multiple of half the wavelength of the carrier frequency of the RF signal to be down converted.

20. Method according to claim 18, characterized in that
the delay corresponds to an integer multiple of a modulation state time duration of the RF signal to be down converted.

21. Method according to claim 15, characterized in that
the step of processing comprises the steps of frequency dividing and frequency multiplying the branched off signal.

22. Method according to claim 21, characterized in that
the division/multiplication factor of the frequency dividing and frequency multiplying step are equal.

23. Method of demodulating by using a method according to claim 14,
wherein the sensed power of the output signal of the three-port junction is processed in an analog manner to detect the modulation states of the RF signal.

24. Method according to claim 23,
wherein the analog processing step comprises an averaging and a hard decision step.

25. Method according to claim 23, characterized in that
the RF signal is a BPSK modulated RF signal.

* * * * *